United States Patent
Lye et al.

(10) Patent No.: US 8,185,330 B2
(45) Date of Patent: May 22, 2012

(54) AUTOMATIC PLACEMENT OF MEASUREMENT GATES

(75) Inventors: Ling Ling Lye, Penang (MY); Fook Shian Toong, Penang (MY); Eric Breakenridge, Clackmannshire (GB); Su Ann Lim, Penang (MY)

(73) Assignee: Agilent Technologies, Inc., Santa Clara, CA (US)

( * ) Notice: Subject to any disclaimer, the term of this patent is extended or adjusted under 35 U.S.C. 154(b) by 947 days.

(21) Appl. No.: 12/055,332

(22) Filed: Mar. 26, 2008

(65) Prior Publication Data

US 2008/0306703 A1    Dec. 11, 2008

(51) Int. Cl.
*G01R 21/00* (2006.01)
*G01R 29/02* (2006.01)

(52) U.S. Cl. ............... 702/60; 702/78; 702/79; 702/188
(58) Field of Classification Search ............. 702/60–79, 702/121–123, 179, 188–191
See application file for complete search history.

(56) References Cited

U.S. PATENT DOCUMENTS

| | | | |
|---|---|---|---|
| 5,815,117 A * | 9/1998 | Kolanek | 342/442 |
| 7,265,700 B2 | 9/2007 | Johnstone et al. | |
| 2007/0001887 A1 * | 1/2007 | Johnstone et al. | 341/155 |

* cited by examiner

*Primary Examiner* — Phuong Huynh

(57) ABSTRACT

A method and apparatus is provided for setting time positions of measurement gates on a signal under test. Signal transition data is calculated by a processor for multiple signal transitions. Measurement gate start and end positions are set relative to the multiple signal transitions based on the received signal transition data.

18 Claims, 5 Drawing Sheets

AUTOMATIC PLACEMENT OF MEASUREMENT GATES

BACKGROUND OF THE INVENTION

Measurement gates are used in power meters to perform time-gated power measurements. The time gating allows for peak and average power measurements in a time domain of interest. The time between the gate start and gate end is used to specify the time domain of interest.

However, a problem with the prior-art methods is that the user must manually set the positions of the gate start and end time, requiring the user to have knowledge of the characteristics of the signal under test.

Another problem is that the positions of the gate start and end time remain fixed once entered by user. The gate positions do not change with every capture/acquisition. This can be a problem when the signal is changing, for example when the signal under test has a pulse width that varies with time.

U.S. Pat. No. 7,265,700 to Johnstone and Breakenridge provides a method to detect the rising and falling edges of pulses from a signal under test which might be changing. However, U.S. Pat. No. 7,265,700 does not use this information to automatically place gates on a pulse of a signal under test for measuring peak power.

It would be desirable to automatically place time gates on a signal under test.

SUMMARY OF THE INVENTION

The present invention provides a method for automatically placing time gates on a signal under test.

In general terms, a method and apparatus is provided for setting time positions of measurement gates on a signal under test. Signal transition data is calculated by a processor for multiple signal transitions. Measurement gate start and end positions are set relative to the multiple signal transitions based on the received signal transition data.

BRIEF DESCRIPTION OF THE DRAWINGS

Further preferred features of the invention will now be described for the sake of example only with reference to the following figures, in which.

DETAILED DESCRIPTION

Figure 1:
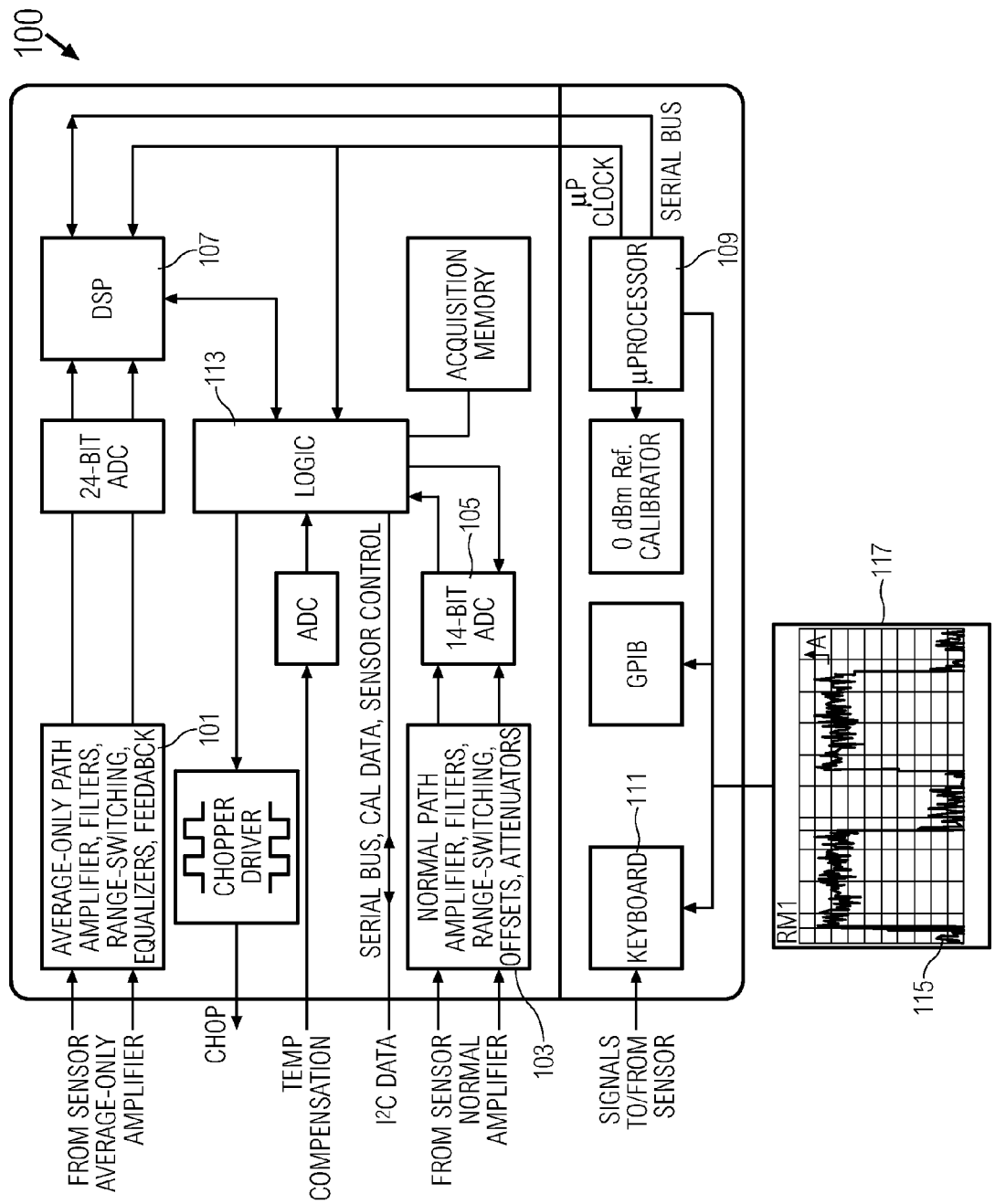
FIG. 1 is a diagrammatic block diagram of a power meter having automatic placement of measurement gates of the present invention.

FIG. 1 is a diagrammatic block diagram of a power meter 100 having automatic placement of measurement gates of an embodiment the present invention. The power meter 100 receives a power-sensor input to either an average-only path 101 or a normal path 103. The average-only path 101 is used in an average-only mode which allows for the use of older types of thermocouple and diode sensors. The normal path 103 makes use of a video amplifier which preserves modulation envelope fidelity and accuracy. A 14-bit ADC ("Analog to Digital Converter") 105 processes the amplified envelope into a data stream for a DSP ("Digital Signal Processor") 107. The ADC 105 allows for envelope detection by the DSP 107. The power meter 100 makes use of continuous sampling to capture all peaks and provide bandwidth correction. A microprocessor 109 coordinates the various functional components including a panel keyboard 111, logic 113 and functions of the DSP 107.

Figure 2:
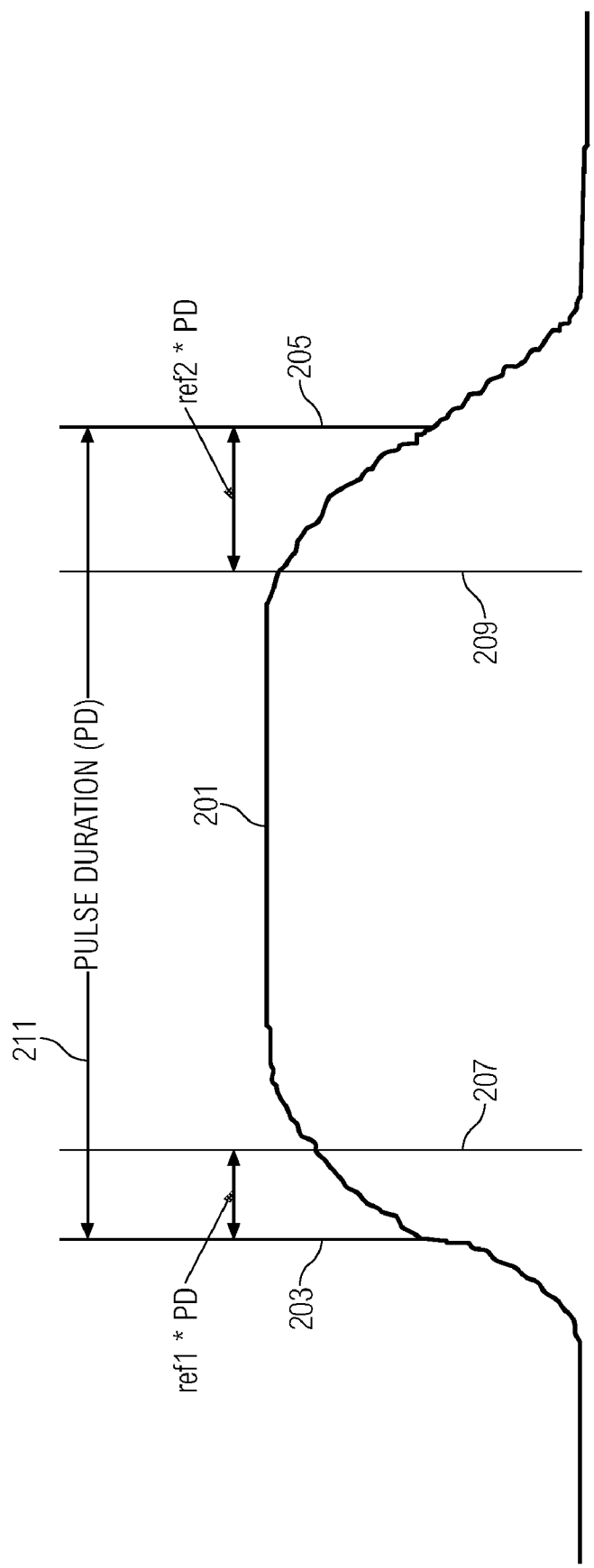
FIG. 2 is an illustrative diagrammatic representation of a pulse of a pulsed signal illustrated in FIG. 1.

FIG. 2 is an illustrative diagrammatic representation of a signal envelope 201. The signal envelope 201 can be the envelope of a simple or complex modulated signal 115 of FIG. 1, or can be defined by the rising and falling edges of a pulse, for example. The important characteristic of the signal envelope 201 is that it includes rising and falling edges of an acquired signal, where the acquired signal can be any type of signal known to those in the art. Multiple signal envelopes 201 will be acquired by the power meter 100 over time and these envelopes 201 can have widths and shapes that change relative to each other and the envelopes 201 can occur at irregular time intervals.

Returning to FIG. 1, the signal under test 115 is illustrated in the time-domain on a display 117. The signal 115 is represented as a trace on the display 117. The display 117 can show time on the horizontal axis and amplitude on the vertical axis. The time increases moving left to right along the horizontal axis. The display 117 is showing two signal envelopes in the illustrated example, although it can display a single or more than two signal envelopes or pulses as well.

Figure 3:
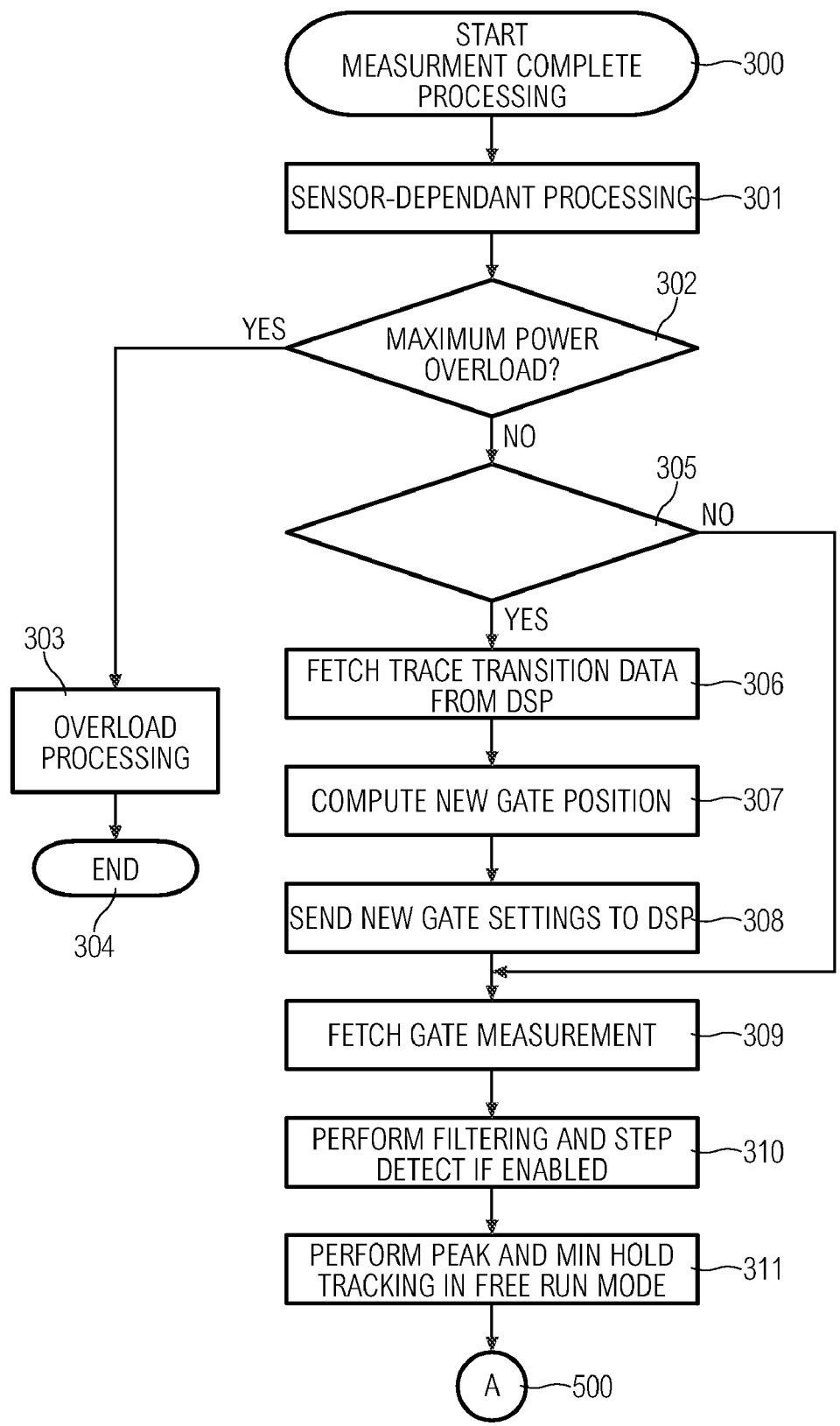
FIG. 3 is a flowchart illustrating steps for setting time positions of measurement gates on pulses of a pulsed signal.

FIG. 3 is a flowchart illustrating steps of a method for setting time positions of measurement gates on envelopes 201 of the modulated signal 115. The method of FIGS. 3 and 4 can be performed using the processor 109 of the power meter 100 or by using an external processor. This method is for performing peak power measurement using a peak-power sensor. The steps of FIG. 3 are performed for multiple (two or more envelopes) or all of the envelopes 201 of the modulated signal 115. STEP 300 starts "measurement complete" processing, meaning that this step is performed after the completion of each successive measurement. Measurement completion is signaled by the DSP 107 on a data acquisition board by means of an interrupt. The interrupt is serviced by the microprocessor 109 by sending a "measurement complete" event which is processed in the main loop of a channel task. Typically the "measurement complete" processing is done for each capture interval in which the signal 115 is acquired by the power meter 100.

The "measurement complete" processing commences with sensor-dependent processing at STEP 301. For example, when using an E932x series sensor from AGILENT TECHNOLOGIES, INC. of Santa Clara, Calif., sensor range switching control is done in auto-ranging and free-run mode. For an N1912x series sensor, also from AGILENT TECHNOLOGIES, INC., auto zero data is fetched from the DSP 107 at this step if auto zeroing is enabled. Thus, different steps can be performed at Step 301 depending on the particular sensor being used.

At STEP 302, a check is performed for power overload by comparing the measured power with the maximum power for the particular sensor. If power overload occurs, power overload processing is done at STEP 303 and the process ends at STEP 304.

Next, if there is no power overload at STEP 302, STEP 305 is performed. If the power meter 100 is set to automatically determine and position measurement gates on the envelopes 201, then when a triggered mode is selected, the process continues to STEP 306.

At STEP 306, trace transition data is fetched from the DSP 107. The trace transition data includes information about the envelopes 201 of the signal 115 such as the times at which a envelope 201 rises and falls, the envelope rise and fall time intervals, the envelope duration, etc., for one or more of the envelopes 201 captured on the display 117.

The trace transition data can be obtained using the method described in U.S. Pat. No. 7,265,700 to Johnstone and Breakenridge for example or any other method known in the art.

The trace transition data can include:
Rise Time, $t_r$;
Location of Rising Edge, $T_{rising}$;
Fall Time, $t_f$;
Location of Falling Edge, $T_{falling}$; and
Envelope Width.

The Rise Time, $t_r$ is traditionally defined as the time taken for the envelope to rise from 10% of maximum power to 90% of maximum power.

Similarly, the Fall Time, $t_f$ is defined as the time taken for the envelope to fall from 90% of maximum power to 10% of maximum power.

The location of the Rising Edge, $T_{rising}$ and Falling Edge, $T_{falling}$ can be defined as the time when the power is 50% of the maximum power. Depending on whether the slope of the signal is positive or negative, it can be determine whether the edge found is a rising edge (positive slope) or falling edge (negative slope).

The Envelope Width is defined as the time from a Rising Edge, $T_{rising}$ to a Falling Edge, $T_{falling}$. It is also desirable to qualify an edge before determining that it is a valid edge, to prevent spurious noises from being identified as an edge.

At STEP 307 a new gate position can be computed. The gate position is computed using the trace transition data and user-defined references. The gate start and end positions are computed such that they are placed relative to the first envelope's rising edge and falling edge, respectively.

STEP 307 is described in more detail with reference to FIG. 4. The computation of the new gate position starts at STEP 400.

At STEP 401 the processor 109 reads reference marker 1 (ref1) and reference marker 2 (ref2). The reference markers can be entered at any time by the user either before the STEP 401 or at STEP 401. The user can enter the markers using keypads of a front panel interface of the power meter 100, using the keyboard 111, or remotely using an interface such as SCSI. The reference markers can be specified by the user as a percentage value.

At STEP 402 a check is performed to determine if both rising and falling edges are found on the trace. This shows whether or not a envelope 201 has been acquired. This can be determined from the trace transition data obtained from the DSP at STEP 306. If the rising and falling edges are not found then the gate computation process is ended at STEP 403 and an "error" is returned.

If both rising and falling edges are found at STEP 402 then STEP 404 is performed.

At STEP 404 the processor 109 identifies the right falling edge of the first of the envelopes 201 on the trace of the signal 115. The right falling edge of the first envelope can be found by first finding the first rising edge of the first envelope. The right falling edge of the first envelope will be the one that trails directly after the first rising edge.

At STEP 405, if no falling edge is found after the first rising edge, a envelope top is considered to have not been found and therefore the process is again ended at STEP 403 and an "error" is returned.

If a envelope top is found at STEP 405 then STEP 406 is performed to compute the new position of the gate start time and the gate end time. Returning to FIG. 2, a first rising edge 203 of the envelope 201 and a right falling edge 205 of the first envelope 201 as determined at STEP 404 are illustrated. At STEP 406 a gate start time 207 and gate end time 209 (also illustrated in FIG. 2) are calculated using the equations:

Gate start time=rise edge occurrence time+(reference marker 1*envelope duration)     (EQUATION 1)

Gate end time=fall edge occurrence time−(reference marker 2*envelope duration)     (EQUATION 2)

Where reference marker 1 (ref1) and reference marker 2 (ref2) are read by the processor 109 at STEP 401 and are expressed as a decimal value between 0 and 1. The rise and fall edge occurrence times and the envelope duration are included in the trace transition data obtained from the DSP at STEP 306. The "envelope duration" 211 is illustrated in FIG. 2 and is the top length time of the first envelope 201. The "rise edge occurrence time" is the time when the first rise edge occurs. The "fall edge occurrence time" is the time when the fall edge occurs after the first rise edge.

As can see from EQUATIONS 1 and 2 and FIG. 2, the location of the gate start time 207 and gate end time 209 can be automatically updated for subsequent signal captures. However, the user can also provide input when desired by setting or updating the reference markers (ref1 and ref2).

The gate computation processing ends for each envelope 201 at STEP 407. The method then continues with STEP 308 of FIG. 3 where the calculated gate settings (the gate start time 207 and gate end time 209) are sent to the DSP 107 on the acquisition board.

At STEP 309 the gated measurement is fetched by the processor 109 from the DSP 107 using the gates with the gate start time 207 and gate end time 209. Also at this step, if the power meter 100 is set to automatically determine and position measurement gates on the envelopes 201, a request for the DSP 107 to redo the measurement is flagged when sending the request for the gated measurement. This step is important because the gated measurement at that point of time is based on the previous gate settings. A re-measurement using the updated gate is required for the DSP 107 so that the gated measurement retrieved is based on the new gate settings.

Figure 4:
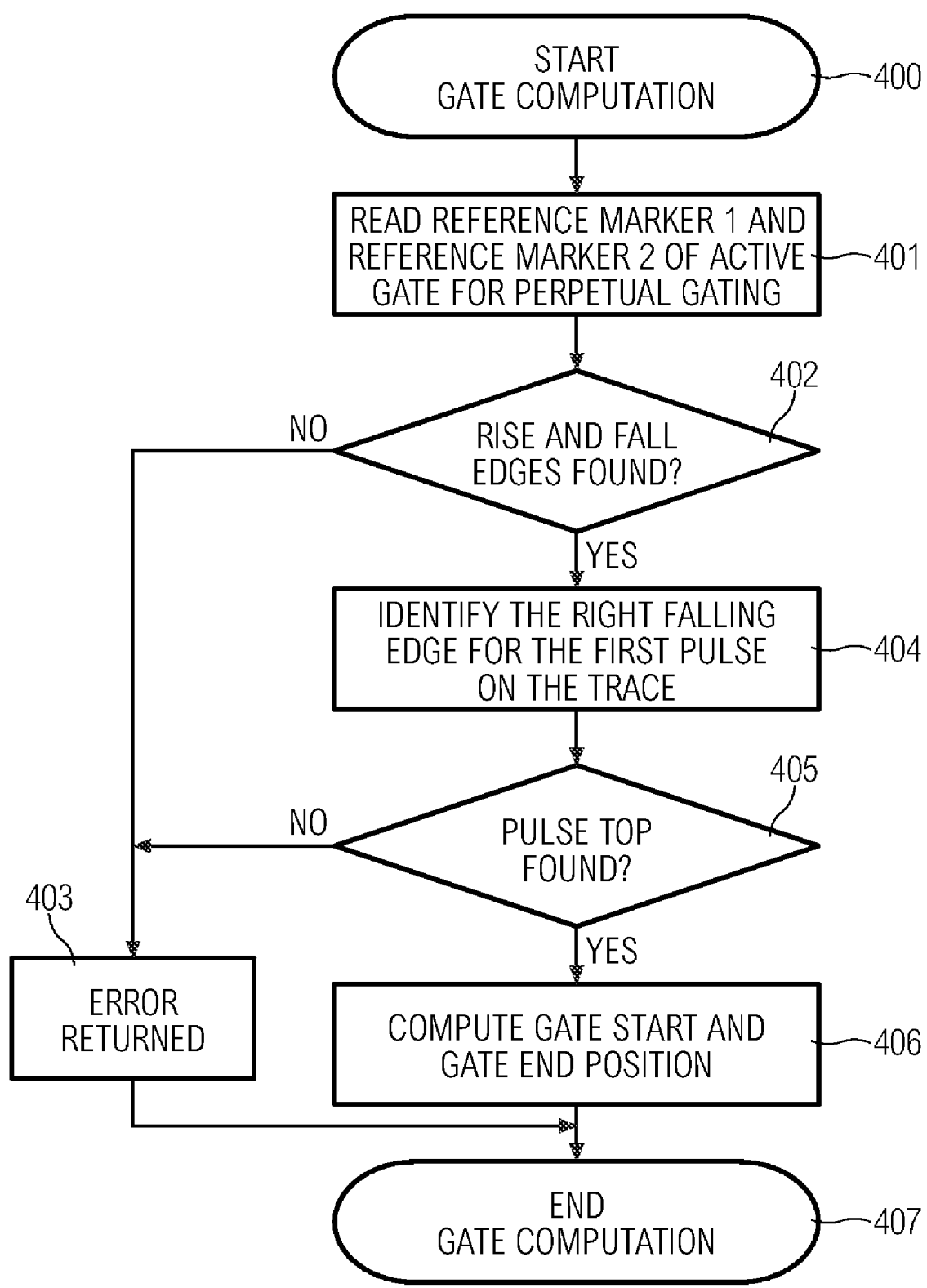
FIG. 4 is a flowchart setting out in more detail the computation of the new gate positions.

However, at STEP 305 if the power meter 100 is not set to automatically determine and position measurement gates on the envelopes 201, then the previous gate settings are retained and the steps of FIG. 4 are not performed for that particular envelope. In that case there is no need for the DSP 107 to redo the measurement.

After retrieving the measurement from the DSP 107 at STEP 309, some post measurement processing can be performed as is known in the art.

At STEP 310 filtering and step detection can be performed if desired.

At STEP 311 a "highest peak" and a "lowest minimum value" feature can be used when tracking in "free run mode" as is known in the art.

Figure 5:
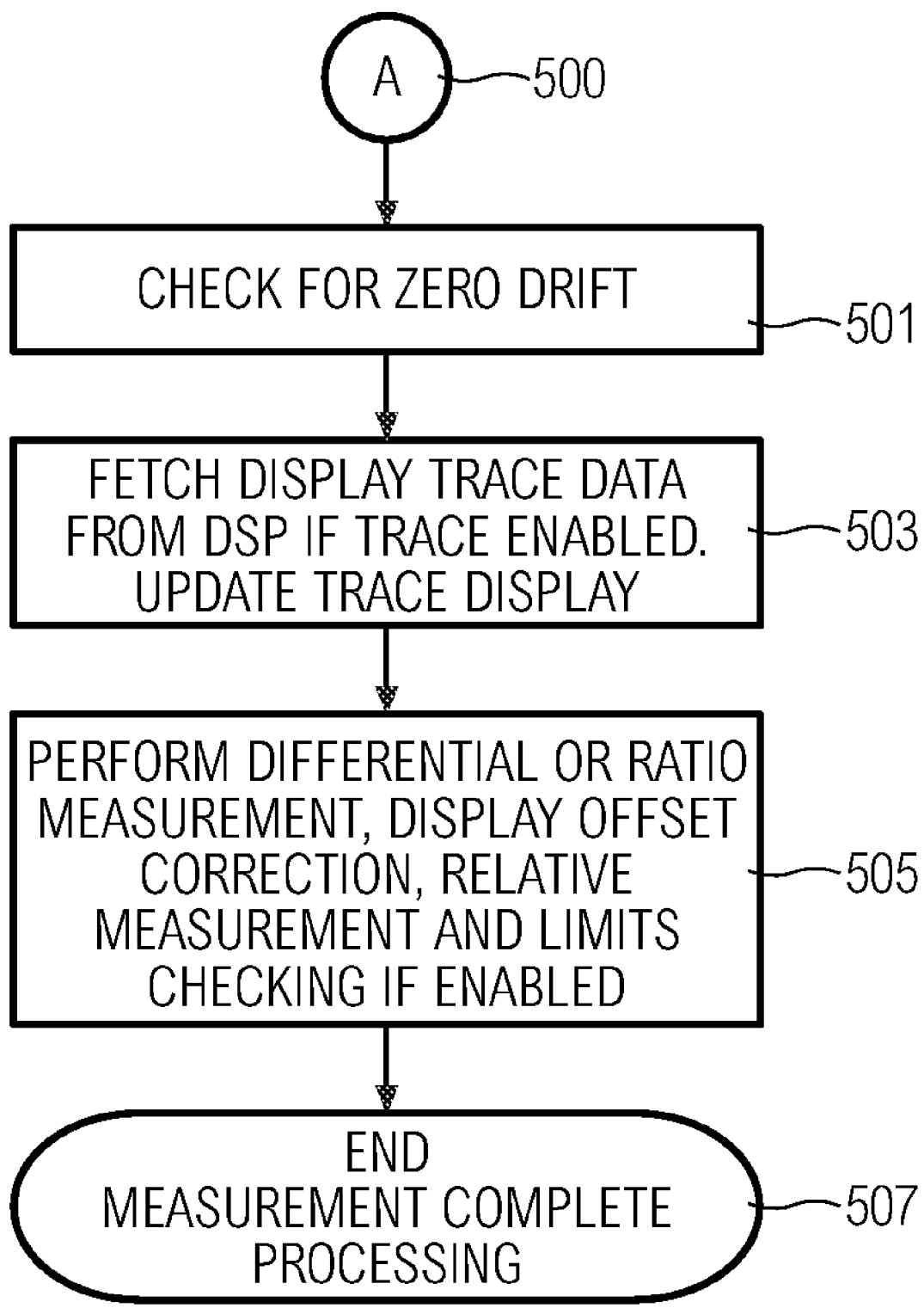
FIG. 5 continues the steps of FIG. 3.

Processing continues at STEP 500 (see FIG. 5). At STEP 501 "zero drift" checking is performed. STEPS 309, 310, 311 and 501 are repeated for multiple gates as desired for the particular power meter 100. At STEP 503 the trace display data for displaying on the display 117 is fetched from the DSP 107 if the trace is enabled, in which case the trace is updated on the display 117.

Finally, before the measurement complete processing 300 ends at STEP 507, STEP 505 can be performed whereby differential or ratio measurement, display offset correction, or relative measurement and limits checking can be performed.

Using the auto-width gating on every capture of the present invention, the gates can be placed on the envelope top for every capture, providing time-gated power measurement in the time domain of interest.

In the foregoing specification, the invention has been described with reference to specific exemplary embodiments thereof. The specification and drawings are, accordingly, to be regarded in an illustrative sense rather than a restrictive sense.

The invention claimed is:

1. A power meter having a function to utilize measurement gates to measure the power of a signal under test comprising
    a digital signal processor for detecting signal transition data for multiple signal transitions, the signal transition data including times of a rising edge and a falling edge of a signal envelope of the signal under test;
    a measurement gate having a start position and an end position, the measurement gate start position being at a time position determined as an interval of time away from the rising edge; and
    a processor for setting the measurement gate start position and end position relative to the multiple signal transitions based on the detected signal transition data, the processor determining the measurement gate start position by determining the interval of time away from the rising edge, and the processor determining the interval of time away from the rising edge using a first reference marker.

2. The power meter of claim 1, wherein the signal envelope is a modulation envelope of the signal under test.

3. The power meter of claim 1, wherein the signal envelope follows the shape of a pulse.

4. The power meter of claim 1 wherein the measurement gate end position is at a time position determined as an interval of time away from the falling edge, the processor determining the measurement gate end position by determining the interval of time away from the falling edge, and the processor determining the interval of time away from the falling edge using a second reference marker.

5. The power meter of claim 1, further comprising an input device for an operator to supply the first reference marker used when determining the interval of time away from the rising edge.

6. The power meter of claim 5, wherein the first reference marker is multiplied by a duration of the envelope being measured to determine the interval of time away from the rising edge.

7. The method of claim 1, wherein the positions are updated upon receipt of data of successive signal transitions.

8. A method for setting time positions of measurement gates on a signal under test comprising the steps of:
    receiving signal transition data calculated by a processor for multiple signal transitions, the signal transition data including times of a rising edge and a falling edge of a signal envelope of the signal under test; and
    setting measurement gate start and end positions relative to the multiple signal transitions based on the received signal transition data, by setting a measurement gate start position at a time position determined as an interval of time away from a rising edge, and determining the interval of time away from the rising edge using a first reference marker.

9. The method of claim 8, wherein the signal envelope is a modulation envelope of the signal under test.

10. The method of claim 8, wherein the signal envelope follows the shape of a pulse.

11. The method of claim 8 wherein the step of setting the measurement gate start and end positions further comprises setting a measurement gate end position at a time position determined as an interval of time away from a falling edge, and determining the interval of time away from the falling edge using a second reference marker.

12. The method of claim 8, wherein the first reference marker is an operator supplied reference marker.

13. The method of claim 12, wherein the first reference marker is multiplied by a duration of the envelope being measured to determine the interval of time away from the rising edge.

14. The method of claim 8, wherein the positions are updated upon receipt of data of successive signal transitions.

15. The power meter of claim 4, wherein the input device is further for the operator to supply the second reference marker used when determining the interval of time away from the falling edge.

16. The power meter of claim 15, wherein the second reference marker is multiplied by a duration of the envelope being measured to determine the interval of time away from the falling edge.

17. The method of claim 11, wherein the second reference marker is an operator supplied reference marker.

18. The method of claim 17, wherein the second reference marker is multiplied by a duration of the envelope being measured to determine the interval of time away from the falling edge.

* * * * *

UNITED STATES PATENT AND TRADEMARK OFFICE
CERTIFICATE OF CORRECTION

PATENT NO.      : 8,185,330 B2
APPLICATION NO. : 12/055332
DATED           : May 22, 2012
INVENTOR(S)     : Ling Ling Lye et al.

It is certified that error appears in the above-identified patent and that said Letters Patent is hereby corrected as shown below:

On the face page, in field (75), in "Inventors", in column 1, line 3, delete "Clackmannshire" and insert -- Clackmannanshire --, therefor.

Signed and Sealed this
Twenty-sixth Day of June, 2012

David J. Kappos
*Director of the United States Patent and Trademark Office*